July 23, 1968 W. J. HOLT, JR., ET AL 3,393,659
SOLDER COATING APPARATUS
Filed Feb. 7, 1966 7 Sheets-Sheet 1
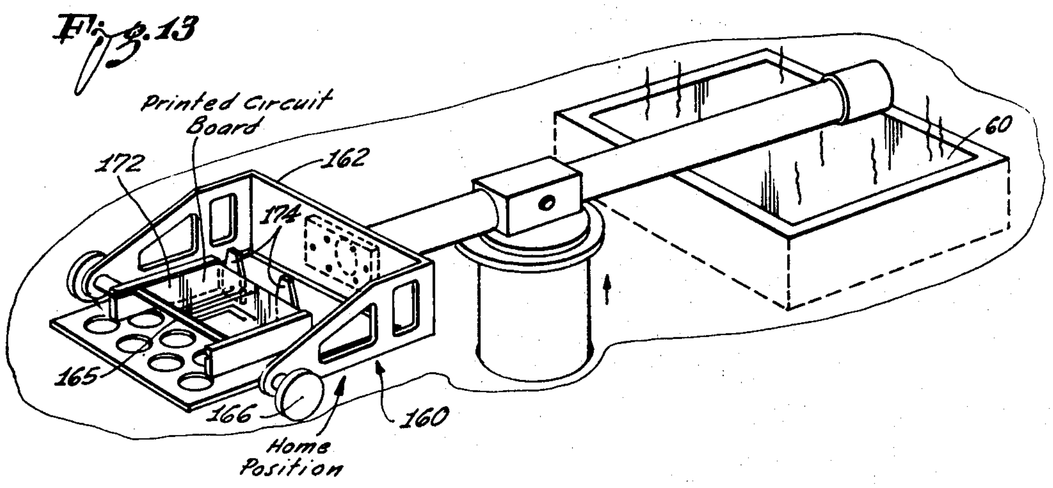
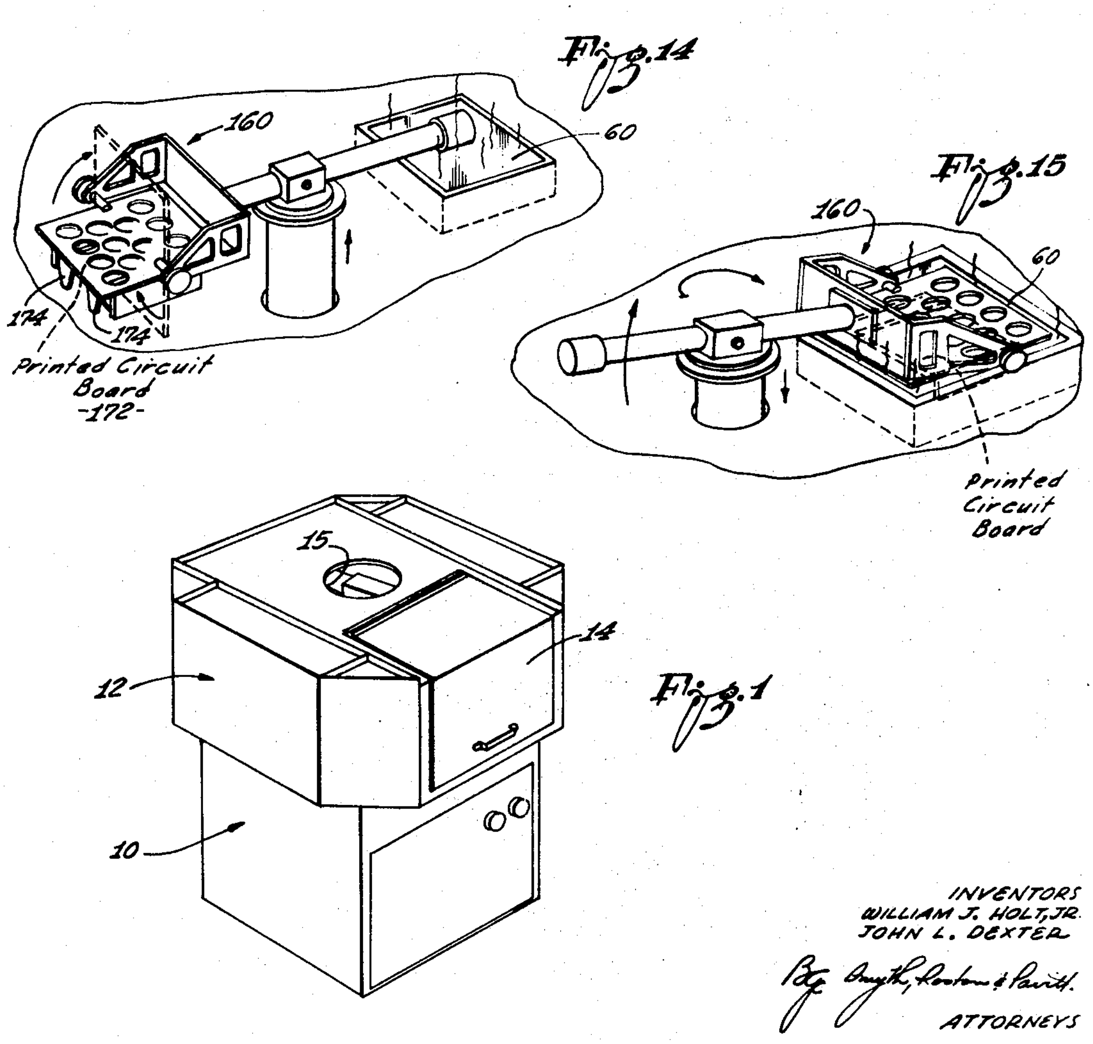
FIG. 14, FIG. 15, FIG. 1
INVENTORS
WILLIAM J. HOLT, JR.
JOHN L. DEXTER
By Smyth, Roston & Pavitt
ATTORNEYS

SOLDER COATING APPARATUS

Filed Feb. 7, 1966 7 Sheets-Sheet 2

INVENTORS
WILLIAM J. HOLT, JR.
JOHN L. DEXTER

By [signature]
ATTORNEYS

INVENTORS:
WILLIAM J. HOLT, JR.
JOHN L. DEXTER

By Smyth, Roston & Pavitt
ATTORNEYS

INVENTORS:
WILLIAM J. HOLT, JR.
JOHN L. DEXTER
By Smyth, Roston & Pavitt
ATTORNEYS

SOLDER COATING APPARATUS

INVENTORS
WILLIAM J. HOLT, JR.
JOHN L. DEXTER
By Smyth, Roston & Pavitt
ATTORNEYS

SOLDER COATING APPARATUS

Filed Feb. 7, 1966 7 Sheets-Sheet 6

INVENTORS:
WILLIAM J. HOLT, JR.
JOHN L. DEXTER
By [signature]
ATTORNEYS

SOLDER COATING APPARATUS

INVENTORS:
WILLIAM J. HOLT, JR.
JOHN L. DEXTER

By [signature]

ATTORNEYS

United States Patent Office 3,393,659

Patented July 23, 1968

3,393,659
SOLDER COATING APPARATUS

William J. Holt, Jr., Pacific Palisades, and John L. Dexter, Culver City, Calif., assignors, by mesne assignments, to Varo Inc. Electrokinetics Div., Santa Barbara, Calif., a corporation of California Filed Feb. 7, 1966, Ser. No. 525,433
13 Claims. (Cl. 118—56)

This invention relates to an apparatus for coating objects and more particularly, relates to an apparatus for coating printed circuit boards with solder.

Printed circuit boards are commonly fabricated by copper coating a sheet of dielectric material, printing a circuit on the copper with etch-resistant ink and then etching away all of the exposed copper to leave the desired printed copper circuit. For the dual purpose of keeping the surface of the copper circuit from weathering and of facilitating subsequent soldering of components to the circuit, the copper circuit may be promptly tinned by dipping the circuit board into a molten solder bath.

When a circuit board is removed from the solder bath the coating is uneven in thickness and all of the small holes in the board are plugged with solder. Early in the art, the dipping operation was followed by subjecting the coated board to a fast slinging or shaking operation by hand to remove the excess solder and clear the holes. Such a manual operation was both uneconomical and inefficient. Later a mechanical aid was used, the newly dipped board being mounted on a motor driven hand drill to be whirled about an axis at the center of the board to remove surplus solder by centrifugal force.

More recently an apparatus has been developed to perform the same whirling operation, the apparatus having an elevated shaft equipped with a holder to retain a circuit board on the end of the shaft with the board perpendicular to the axis of the shaft. The shaft is swung to a horizontal position for loading and unloading the circuit boards and is swung to a pendent vertical position for dipping the board in molten solder. Subsequently the shaft while in vertical position is rotated to whirl the board about its center.

One disadvantage of such an apparatus is the excessive height of the machine and the excessive vertical dimension of the processing chamber required by the use of a pendent shaft and the range of swinging movement of the shaft. Another disadvantage is that the generated centrifugal force varies widely from zero magnitude at the center of the board to excessive magnitude in the outer radial regions of the board. Consequently the solder is not spread evenly by the whirling action and, moreover, the solder is not removed from holes close to the center of the board. A further disadvantage is that the board must be spun at an exceedingly high angular rate at which any unbalance may have troublesome effects. Accordingly the boards must be carefully balanced and careful readjustments must be made whenever a change-over is made from one size of board to another.

The present invention avoids all of these disadvantages by placing the boards substantially horizontally on the outer end of a horizontal boom that extends radially from the upper end of an upright power shaft that is capable of both rotation on its axis and movement up and down along its axis. The boards are loaded at a loading or home position of the boom and then the shaft is rotated to place the board over a molten solder bath. The vertical shaft is lowered axially to dip the board and then is returned to lift the board clear of the bath. The shaft is then rotated at a moderate high speed to remove surplus solder.

The geometry of the new arrangement makes possible a compact apparatus of convenient height with a processing chamber of relatively small vertical dimension. The centrifugal force varies gradually across the width of the board and is reliably effective over the entire area of the board for unplugging all of the holes. The solder coating is uniform and may have a thickness for example of approximately .0002″. The thickness of the solder coating may be controlled between .0001″ and .0005″ by varying the solder temperature, the duration of the dipping step and the duration of the spinning step. The arrangement inherently simplifies the problem of static and dynamic balance largely because the relatively large radius of the orbit of motion of a circuit board makes it possible to create an effective magnitude of centrifugal force at a relatively low angular velocity, for example at 300 r.p.m. as distinguished from 1200 or higher r.p.m. In the preferred embodiment of the invention a counterweight to balance the holder on the boom is adjusted to balance a circuit board of average size, and because of the relatively low rate of rotation it is usually unnecessary to readjust the counterweight for boards that weigh above or below average.

The features and advantages of the invention may be understood from the following detailed description and the accompanying drawings.

In the drawings, which are to be regarded as merely illustrative:

FIG. 1 is a perspective view of the presently preferred embodiment of the invention;

FIG. 13 is a perspective view of a boom equipped with an alternate form of circuit board holder with the holder shown in its loading position;

FIG. 14 is a similar view showing the holder rotated to its operating position for the spinning operation;

FIG. 15 is a perspective view showing the holder in the course of the dipping operation.

*General arrangement*

FIG. 1, illustrating the presently preferred embodiment of the invention, shows a housing forming lower chamber 10 which serves as a pedestal and forming an upper processing chamber 12. The processing chamber has a door 14 at a loading station and has an opposite door (not shown) for access to a solder bath at a dipping station. The processing chamber 12 also has a top opening 15 to serve as a vent and a fan may be provided at the vent for forced air circulation.

Figure 2:
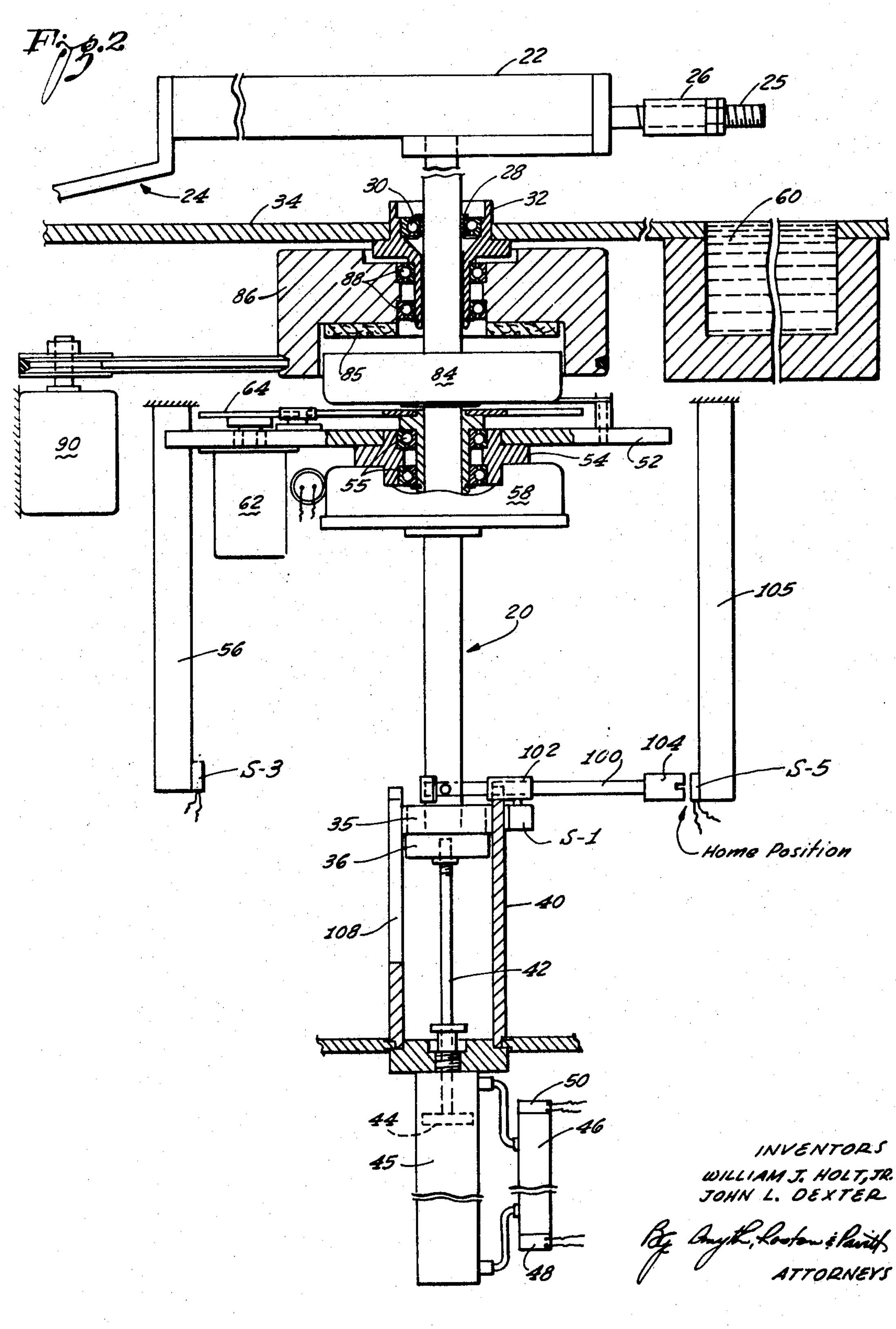
FIG. 2 is a vertical section of the working parts of the apparatus with the boom at the loading or home position.

As shown in FIG. 2, a vertical shaft 20 that is both rotatable and axially movable carries a boom 22 at its upper end with a holder, generally designated 24, at its outer end for releasably retaining circuit boards that are to be coated with solder. The boom is counterbalanced and for this purpose has a counterbalance arm 25 carrying an adjustable counterweight 26. The upper end of the shaft 20 is slidable in a bronze collar 28 which is embraced by a ball bearing 30, the ball bearing being carried by a sleeve 32 that is rigidly supported by the bottom wall 34 of the processing chamber 12.

The lower end of the shaft 20 is supported by a thrust bearing 35 in a cup member 36 that is slidable in an upright guide tube 40 and is carried by a piston rod 42. The piston rod 42 extends upward from a piston 44 in a pneumatic power cylinder 45. The power cylinder 45 is supplied with compressed air under the control of a 4-way valve 46 that is operated by an "up" solenoid 48 for lifting the shaft 20 and is operated by a "down" solenoid 50 for lowering the shaft.

A nonrotating carrier plate 52 is supported for up and down movement with the shaft 20 by means of a collar 52 that is carried by a pair of roller bearings 55 on the shaft. To keep the carrier plate 52 from rotating with the shaft the periphery of the carrier plate is formed with a notch that is in sliding engagement with a vertical pendent guide bar 56. Below the carrier plate 52 the collar 54 supports an electrically actuated brake 58 for decelerating the drive shaft 20. The brake 58 may be a model PB–825 brake manufactured by Warner Electric Brake and Clutch Company, Beloit, Wis.

Figures 3, 4:
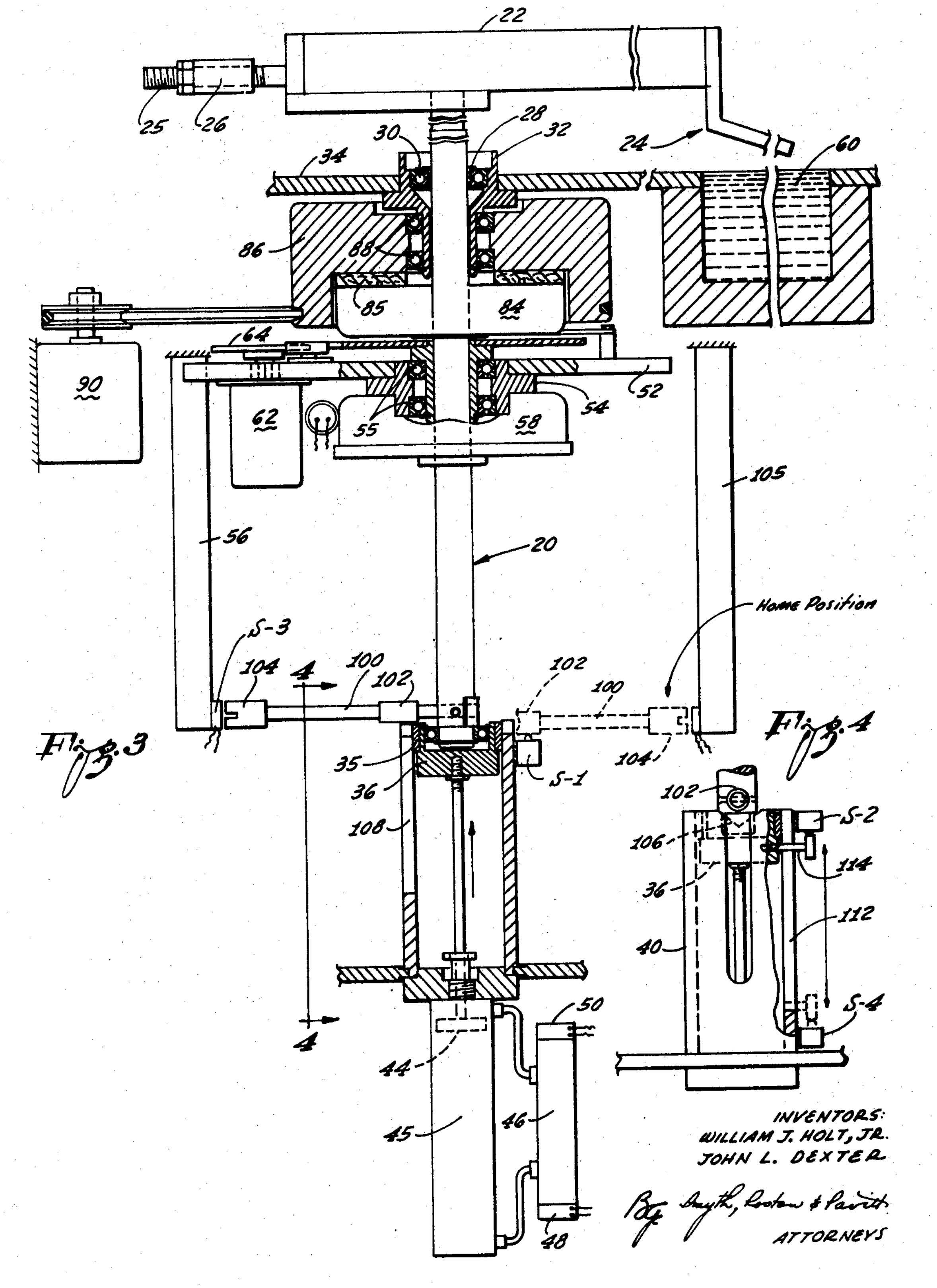
FIG. 3 is a similar sectional view with the boom rotated to a position over a solder bath at the solder or dipping station.
FIG. 4 is a fragmentary view of a lower portion of the apparatus partly in side elevation and partly in section showing how limit switches are arranged to respond to vertical movements of the shaft.
Figures 6, 7:
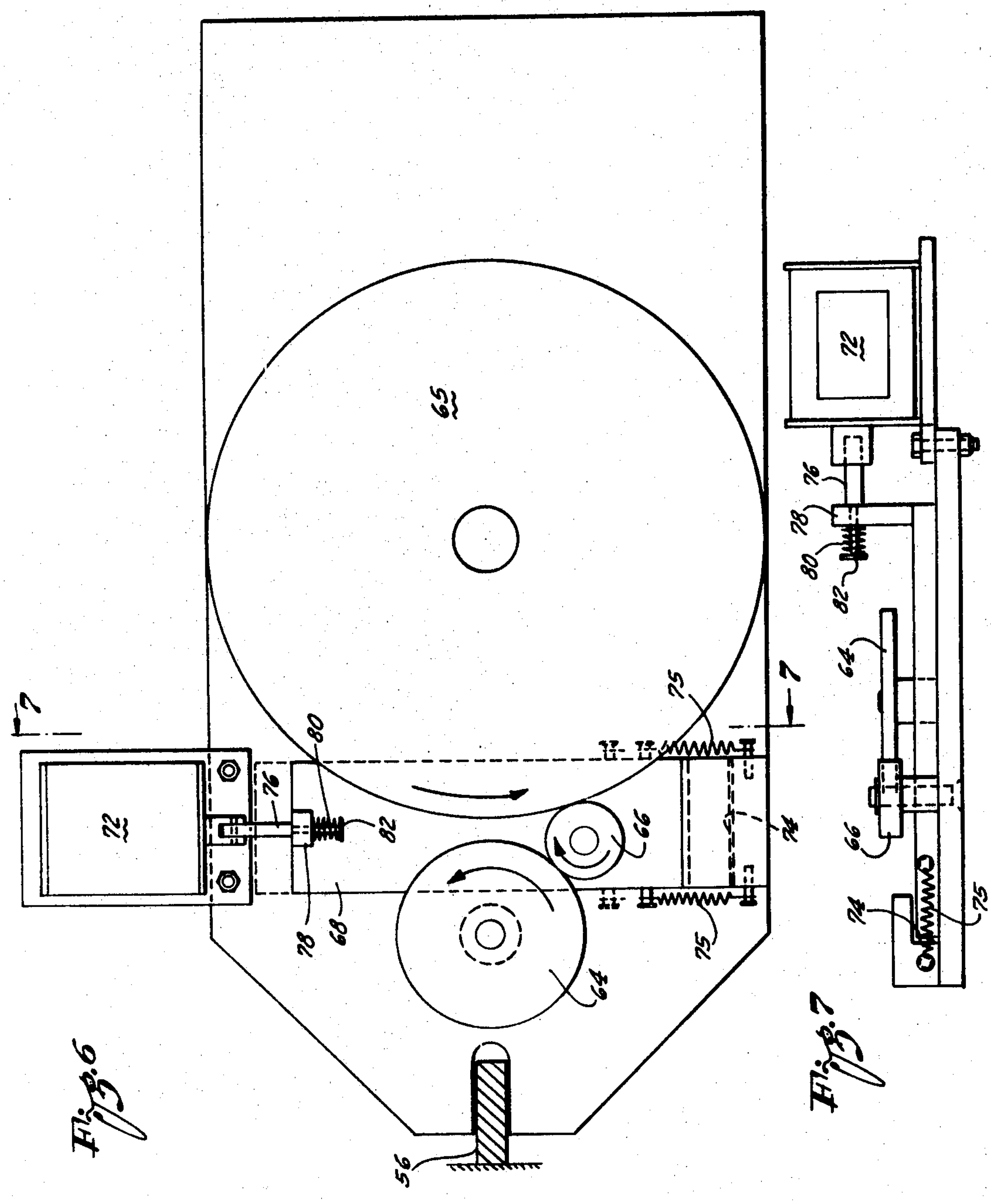
FIG. 6 is a plan view of a low speed drive mechanism for rotating the boom from one station to another.
FIG. 7 is a section along the line 7—7 of FIG. 6.

Mounted on the carrier plate 52 is a suitable low-speed drive mechanism for swinging the boom between the home or loading position shown in FIG. 2 and a diametrically opposite position over a molten solder bath 60 at a dipping station as shown in FIG. 3. The low speed drive mechanism includes a relatively slow motion 62 that actuates a friction drive wheel 64. As best shown in FIG. 6, the shaft 20 is provided with a relatively large friction wheel 65 which may be operatively connected to the friction drive wheel 64 by a friction idler wheel 66 which may be termed a clutch wheel since it serves the purpose of a clutch.

The friction clutch wheel 66 is mounted on a slidable plate 68 by an upright spindle 70 and the slidable plate is controlled by a solenoid 72 which may be termed a positioning solenoid since it is energized whenever it is desired to position the boom 22 at either the loadng station or the soldering station. In the construction shown, the slidable plate 68 is normally retracted against a stop 74 by a pair of tension springs 75 with the clutch wheel 66 out of contact with the two friction wheels 64 and 65.

The solenoid 72 is connected to the slidable plate 68 by a pull rod 76 that extends through a collar 78 on the plate, a suitable compression spring 80 being interposed between the collar and a head 82 on the end of the rod. When the positioning solenoid 72 is energized, the compression spring 80 causes the clutch wheel 66 to be yieldingly pressed against the two friction wheels 64 and 65.

Fixedly keyed to the shaft 20 for up and down movement therewith is an electrically actuated clutch 84 for cooperation with clutch facing 85 on the underside of a flywheel 86. The flywheel 86 is journalled on the previously mentioned fixed sleeve 32 by means of a pair of ball bearings 88 and is driven by a high speed motor 90. In the construction shown, a V-belt 92 connects the flywheel 86 with a drive sheave 94 carried by the motor 90. The clutch 58 may be a model SF–825 clutch manufactured by the Warner Electric Brake and Clutch Company.

After a circuit board is placed in the holder 24 at the loading or home station, the positioning solenoid 72 may be energized to bring the continuously rotating clutch wheel 66 into contact with the two friction wheels 64 and 65 to rotate the shaft 20 slowly to swing the boom 22 to the solder station whereupon the brake 58 may be actuated to stop the boom. The down solenoid 50 may then be energized for operation of the power cylinder 45 to lower the shaft 20 and thereby immerse the holder 24 in the solder bath 60. After a suitable period of immersion of the circuit board in the solder bath, the up solenoid 48 may be energized to move the shaft 20 axially upward to lift the circuit board out of the solder bath.

With the flywheel 86 continuously actuated by the high speed motor 90, the clutch 84 may then be actuated to cause the shaft 20 to be rotated at high speed by the flywheel 86 for centrifugal action on the newly dipped circuit board. After a suitable period of centrifugal action the brake 58 may be actuated briefly to decelerate the boom and then the positioning solenoid 72 may be energized to operate the clutch wheel 66 long enough to swing the boom back to the loading station.

*Automatic control system*

The shaft 20 is provided with a radial control member in the form of an arm 100 which carries a roller 102 for rolling contact with the rim of the guide tube 40 and which also carries a permanent magnet 104 on its outer end for cooperation with proximity switches. In the construction shown in the drawings, a magnetically responsive reed switch S–3 corresponding to the position of the boom 22 at the solder station is mounted on the previously mentioned pendent guide bar 56 and a second similar reed switch S–5 on a second pendent bar 105 corresponds to the home or loading position of the boom.

In FIG. 2 where the boom 22 is at the home position, the bronze roller 102 seats in a V-shaped notch 106 (FIG. 4) in the upper end of the guide tube 40 and thereby supports the shaft 20 and the boom 22 at slightly below the maximum elevation of the boom. At this time the clutch 84 is slightly spaced below the clutch facing 85 as may be seen in FIG. 2. At this home position of the boom the roller 102 resting in the notch 106 closes a normally open microswitch S–1.

Figure 5:
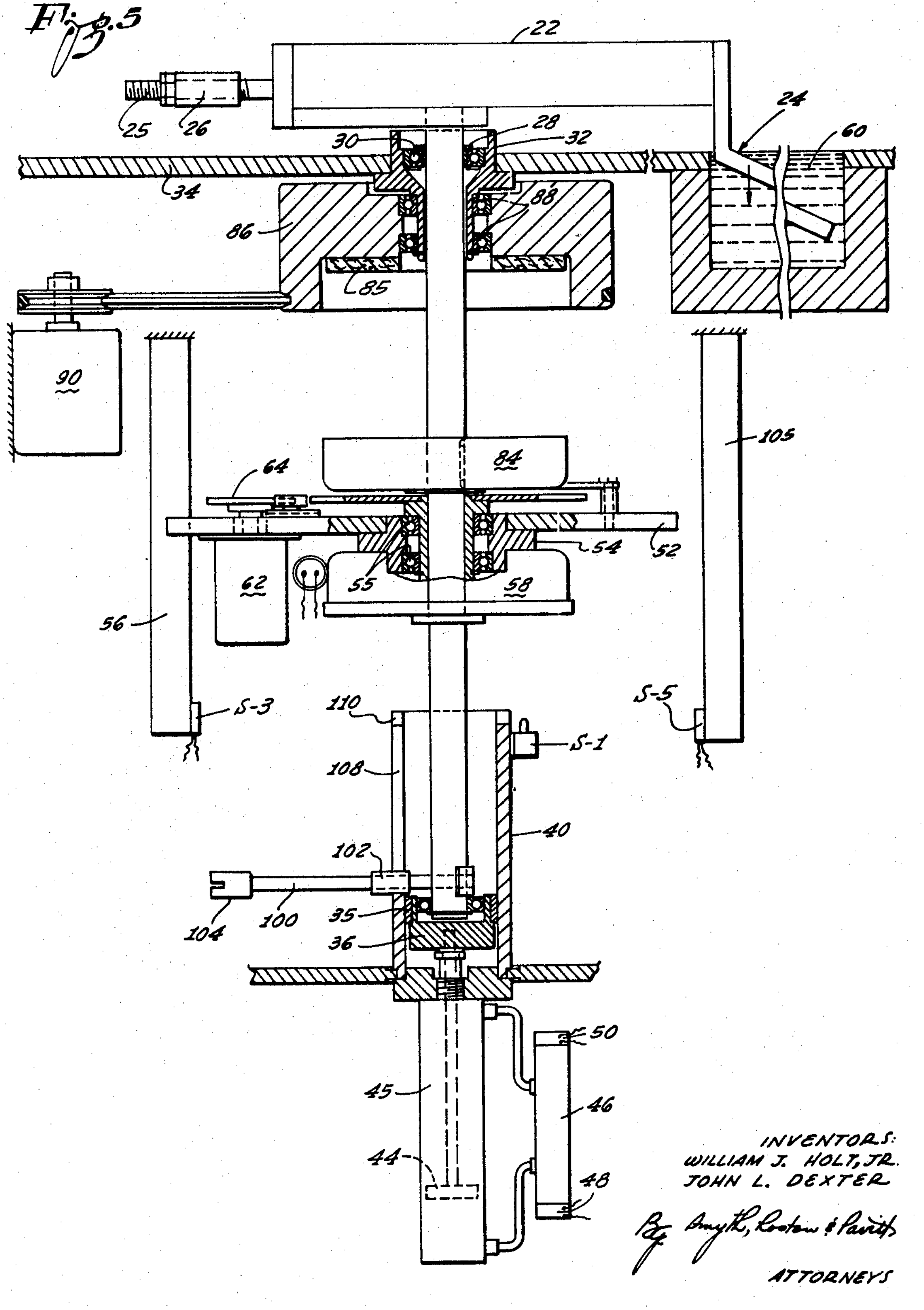
FIG. 5 is a similar view showing the boom lowered to immerse a circuit board in the solder.

The guide tube 40 is further formed with an elongated slot 108 positioned 90° away from the notch 106, which slot cooperates with the roller 102 to keep the boom aligned with the solder bath 60 as shown in FIG. 5 when the boom is lowered for dipping a circuit board, the slot being widened at its upper end as indicated at 110 to guide the roller into the slot. As shown in FIG. 4 the guide tube is further provided with an elongated slot 112 to clear a control finger 114 that extends radially outward from the cup member 35 to actuate an upper limit switch S–2 and a lower limit switch S–4.

The mode of operation of the control system in carrying out an automatic operating cycle may be understood by referring to the wiring diagram in FIG. 15.

The wiring diagram includes relay coils M, A, B, C, D, E, F, G, H, and J. The control system includes a failsafe latch solenoid 115 which unlocks the door 14 when energized and locks the door when deenergized. In addition the control system includes the previously mentioned "up" solenoid 48, "down" solenoid 50 and positioning solenoid 72. A brake control 116 is provided to control the brake 58 and the clutch 84. The control system further includes a dip timer L, a spin timer 118 and additional timers R, K, N and P.

With the newly installed circuit board in the holder 24 and both doors of the processing chamber closed, a start button 120 is depressed until an indicator lamp 122 stays lit. The start button 120 is in parallel with the previously mentioned microswitch S–1; the indicator lamp 116 is in parallel with the relay coil A; and the relay coil A is in series with four switches S–6, S–7, S–8 and S–9. S–6 closes if there is sufficient air pressure for operation of the power cylinder 45; S–7 closes if the solder is up to temperature; and S–8 and S–9 close if the two doors of the processing chamber are closed.

The energization of relay A opens contact A–1 to deenergize the latch solenoid 115 to lock the door 14 at the loading station and contact A–2 closes to apply power to the control circuits. "Up" solenoid 48 is energized through H–5, D–1 and M–2 to lift the shaft 20 and thereby lift the roller 102 out of the home notch 106. The consequent closing of the normally closed microswitch S–1 locks in relay A to keep the relay and indicator lamp 116 energized independently of the start button 120.

The elevation of the shaft 20 and the boom 22 carried thereby results in the control finger 114 closing the upper limit switch S–2 with consequent energization of relay C. Closing the normally open relay contact C–1 energizes the position solenoid 72 through contacts D–2, C–1 and H–2. With the low speed motor 62 in continuous operation the movement of the friction clutch wheel 66 into its effective position by the position solenoid 72 results in rotation of the boom to the solder station with consequent closing of the reed switch S–3 to energize relay D and timer R, the relay being locked by normally open relay contact D–4.

Normally closed D–2 opens to deenergize the position solenoid 72 for retraction of the friction clutch wheel 66 and normally open D–3 closes to apply the brake 58 to stop the boom at the solder station by energizing the brake control 116 through E–1, C–2 and M–5. Normally open contacts D–4 and R–1 close to energize "down" solenoid 50 through E–3, the closing of R–1 being delayed two seconds by the timer R to permit disengagement of the friction clutch wheel 66.

The power cylinder 45 drops the shaft 20 to lower the holder 24 into the solder bath 60, the radial arm 100 moving downward through te guide slot 108. At the same time the control finger 114 moves downward in the slot 112 to open the upper limit switch S–2 for deenergization of relay C, with consequent opening of C–2 to release the brake 58 to free the shaft 20 to permit the flared entrance to the slot 108 to cooperate with the roller 102 to guide the radial arm 100 into the slot. The slot 108 serves to keep the descending holder 24 centered relative to the solder bath 60.

When the descending control finger 114 closes the lower limit switch S–4 to energize relay E and dip timer L, this circuit is locked by normally open E–2. At the end of the interval for which the dip timer L is set, say three to five seconds, normally open L–1 closes to energize the "up" solenoid 48 through H–5 and M–2 to cause the power cylinder 45 to lift the shaft 20 for lifting the holder 24 out of the solder bath. The upward movement of the shaft causes the control finger 114 to close the upper limit switch S–2 to energize relays B and C. With the flywheel 86 continuously rotated by the high speed motor 90, the clutch 84 is energized through F–3, B–1, M–5, B–3 and F–2 to rotate the shaft 20 to spin the boom at high speed. At the same time B–2 closes to energize the spin timer 118.

At the end of the spin cycle the normally open contacts of spin timer 118 close to energize relay F along with the two timers N and K, the circuit being locked by F–1. Timer K is set for five seconds and timer N is set for two seconds. F–3 opens to release the clutch 84 and F–4 opens to deenerzige relays C and D. After one second, timer N operates to close N–1 to energize relay G via J–2. G–1 closes to operate the brake 58 for the two seconds remaining on the timer K, the two second interval being sufficient to decelerate the boom to a desired degree. At the end of the two seconds, K–2 closes to energize relay J and J–2 opens to deenergize relay G. G–1 opens to release the brake 58 at the end of the two second period and J–1 closes to energize the position solenoid 72 to make the friction clutch wheel 66 effective to rotate the boom to the home position. At the home position of the boom, the red switch S–5 closes to energize relay H and timer P, the circuit being locked by H–3. H–2 opens to deenergize the position solenoid 72 and H–4 applies the brake to immobilize the boom.

H–5 opens to deenergize "up" solenoid 48 and H–1 closes to energize the "down" solenoid 50 after the two second delay by timer P to start lowering of the boom at the home position. The lowering of the boom causes the control finger 114 to open the upper limit switch S–2 to deenergize relay B to open the brake circuit through H–4 to free the boom for centering of the roller S–2 in the home notch 106. The seating of the roller S–2 in the home notch 106 opens the microswitch S–1 to deenergize relay A whereupon A–2 opens to cut off the power to the control circuits and A–1 closes to energize the latch solenoid 115 for unlatching the door 14.

*The fixture for releasably holding circuit boards*

The construction of the previously mentioned holder 24 is shown in FIGS. 8 to 12. A rigid rectangular frame is formed by two parallel channel bars 123 and 124, an upper cross bar 125 and two parallel cross bars 126 that are formed with spaced slots 128. Two spaced longitudinal bars 130 are adjustably mounted on the two parallel bars 126 by means of screws which enter the slots 128 selectively and which are equipped with thumb nuts 132. The forward end of the rectangular frame is closed by a front bar 134 which is pivoted at one end to channel bar 123 by a pin 135 and which at the other end is releasably engaged by suitable latch means on the end of channel bar 124.

Figures 8, 9, 10, 11, 12:
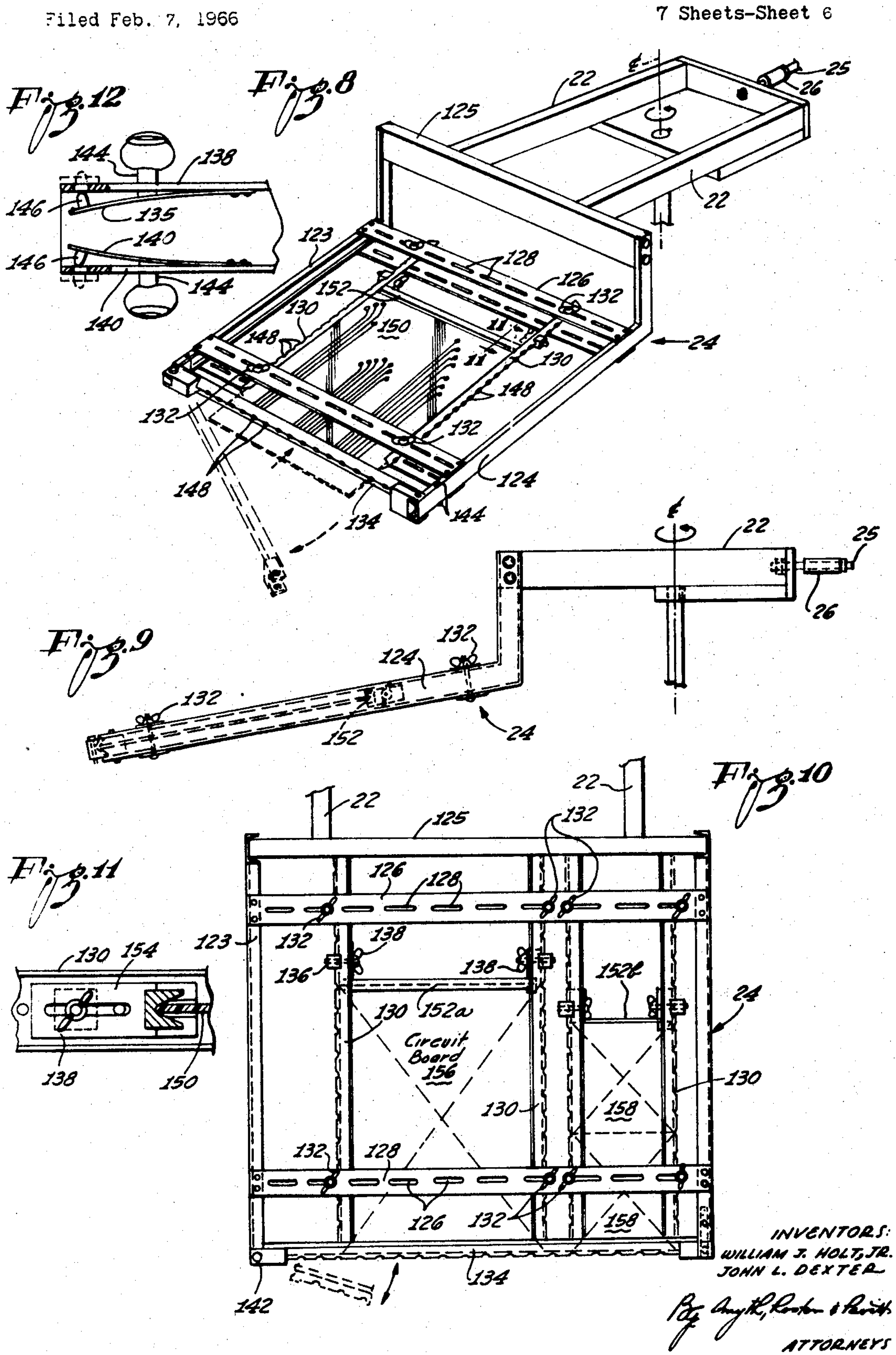
FIG. 8 is a perspective view of the presently preferred holder for circuit boards at the outer end of the boom.
FIG. 9 is a side elevation of the holder and the boom.
FIG. 10 is a plan view of the holder.
FIGURE 11 is an enlarged fragmentary section taken along the line 11—11 of FIG. 10.
FIG. 12 is a fragmentary sectional view of a manually releasable latch incorporated in the holder construction.
Figure 16:
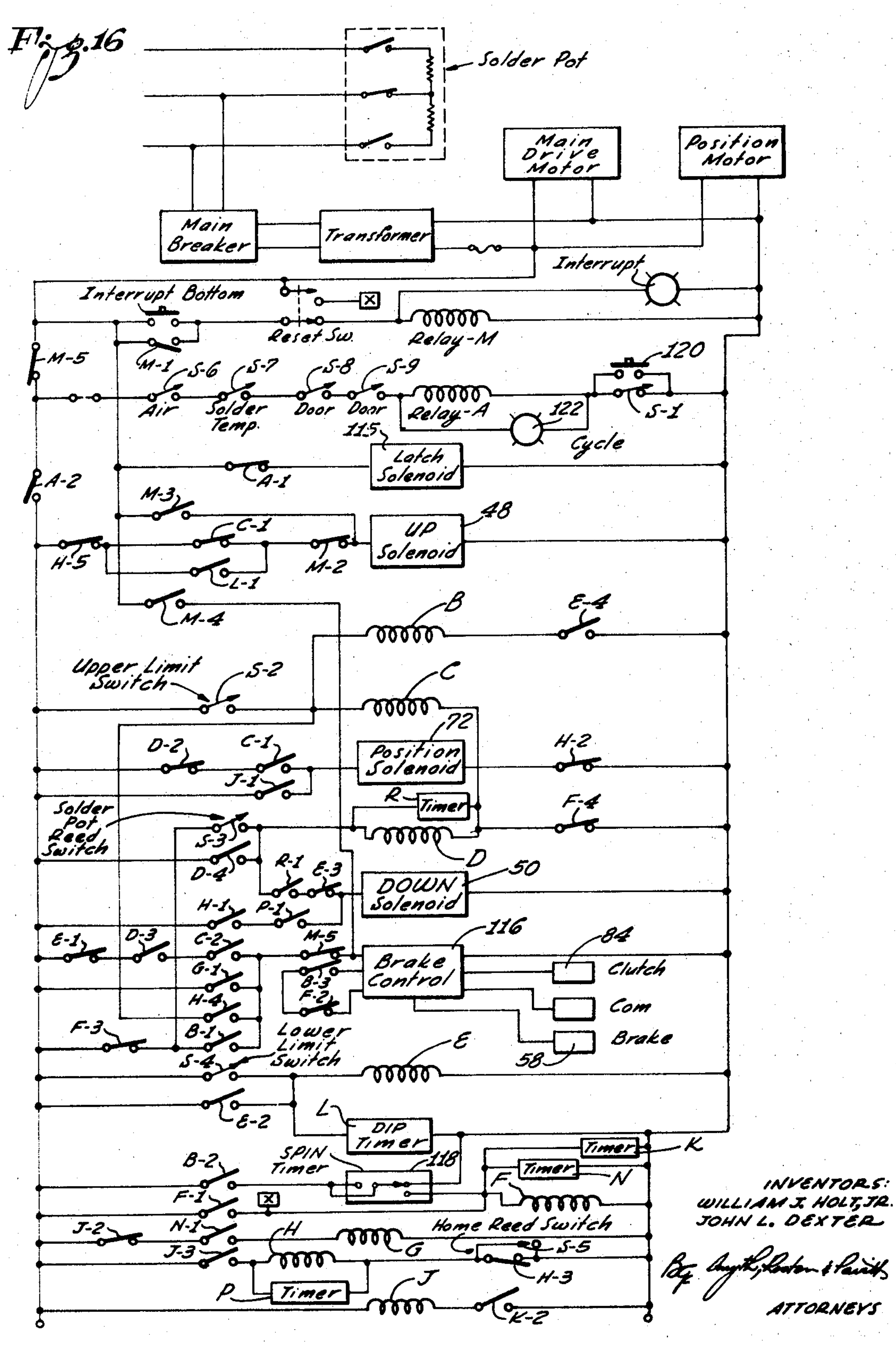
FIG. 16 is a wiring diagram of the automatic control system.

The latch means may be of the construction shown in FIG. 12 which shows a leaf spring 135 mounted on the underside of the upper flange 138 of the channel bar 124 and a second leaf spring 140 is mounted on the upper side of the lower flange 142 of the channel bar. Each leaf spring is equipped with a rearward pin 144 which extends through a corresponding bore in the corresponding flange of the channel bar 124 and each leaf spring is further equipped with a forward pin 146 which extends through a corresponding bore in the corresponding flange of the channel bar. The swingable end of the front bar 134 is forked to straddle the end of the channel bar 124 and is provided with bores to receive the two pins 146.

It is apparent that the two pins 144 may be depressed by finger pressure as indicated in FIG. 12 to retract the two pins 146 for releasing the swinging end of the front bar 134. The front bar 134 as well as the two longitudinal bars 130 are formed of sheet metal bent to a V-shaped cross section to straddle the edges of circuit boards. In effect the two longitudinal bars 130 form a guideway to slidingly receive a circuit board. The two longitudinal bars 130 and the front bar 134 have spaced apertures 148 to release any liquid solder that may be trapped therein.

FIG. 8 shows the two longitudinal bars 130 positioned to engage the opposite edges of a relatively large circuit board 150 and further shows the rear edge of the circuit board engaged by a stop bar 152. The stop bar 152 is a solid bar with a V-shaped channel as shown in cross section in FIG. 11. The cross bar 152 has small slotted blocks 154 united with its opposite ends to fit into the channels of the longitudinal bars 130 and suitable screws equipped with thumb nuts 155 releasably anchor the slotted blocks to the longitudinal bars, the screws being dimensioned to enter the spaced apertures 148 selectively. The stop bar 152 is positioned to cooperate with the front bar 134 to grip the circuit board 150 by its rearward and forward edges.

It is apparent that with the holder adjusted in the described manner in accord with the dimensions of the circuit board 150, it is a simple matter to unlatch the front bar 134 and to swing the front bar open to permit the holder to receive the circuit board. The circuit board is inserted into sliding engagement with two longitudinal bars 130 and is backed against the stop bar 152. The front bar 134 is then closed and latched.

FIG. 10 shows how the holder 24 may be adapted to hold a plurality of circuit boards. A circuit board 156 of moderate size is engaged in the previously described manner by the two longitudinal bars 130 and a stop bar 152*a* of appropriate dimension. Two smaller circuit boards 158 positioned end for end are engaged at their opposite sides by a second pair of longitudinal bars 130. With the innermost circuit board 156 abutting a stop bar 152*b* of appropriate length, the large circuit board 156 and the two smaller circuit boards 158 may be releasably retained by latching the front bar 134.

FIGS. 13 and 14 show an alternate form of holder, generally designated 160, that may be employed to releasably retain circuit boards for the dipping operation. The holder 160 includes a U-shaped bracket 162 that is fixedly mounted on the end of a boom 22*a*. A perforated plate 164 is rigidly mounted on a cross rod 165 which is journalled in the arms of the bracket 162 for rotation of the plate about the axis of the cross bar. The outer ends of the cross bars 165 may be provided with knobs 166 for manual rotation of the perforated plate 164.

Adjustably mounted on the normally upper side of the plate 164 is a pair of parallel bars 168 having longitudinal grooves 170 to form a guideway to engage the opposite side edges of a circuit board 172. As shown in FIG. 13 the circuit board abuts a pair of stop tongues 174.

The operator inserts a printed circuit board 172 in the guideway to the position shown in FIG. 13 and then manipulates one or both of the knobs 166 to rotate the perforated circuit board to upside down position as shown in FIG. 14. In FIG. 13 the center of gravity of the perforated plate 164 and its components is rearward of the axis of the cross rod 165 so that when the perforated plate is reversed to the position shown in FIG. 14 the center of gravity is forward of the cross rod. Consequently centrifugal force caused by spinning of the boom maintains the perforated plate in its upside down position.

After the holder is immersed in the solder bath 60 as shown in FIG. 15, the boom is elevated for the usual spinning operation. The centrifugal force not only maintains the perforated plate in its upside down position but also urges the circuit board 172 outward against the stop tongues 174. Subsequently the perforated plate 164 is manually rotated back to its initial position for removal of the circuit board.

Our description in specific detail of the selected practice of the invention will suggest various changes, substitutions and other departures from our dislcosure within the spirit and scope of the appended claims.

We claim:

1. In an apparatus to apply a coating to an object, for example to apply a coating of solder to a circuit board, the combination of:
- an upright axially movable shaft;
- a boom mounted on said shaft;
- a holder on the boom for the object to be coated;
- means to provide a bath of coating material;
- means to rotate the shaft to move the boom to a first loading station and a second dipping station at the bath of coating material;
- means to lower and raise the shaft axially for briefly imersing the object in the coating bath;
- said rotating means rotating the boom about an axis spaced from the holder to spin the holder in a circular orbit to subject the object to centrifugal force across the surface of the object from the inner end of the object to the outer end of the object to remove surplus coating material from the object;
- said means for rotating the shaft comprising a low speed driving means and a high speed driving means for selectively driving the shaft whereby the low speed driving means may be used to position the boom at the two stations selectively and the high speed driving means may be used to spin the boom; and
- braking means to decelerate the shaft.

2. A combination as set forth in claim 1 in which the high speed driving means is adapted for continuous operation;

- in which two clutches are provided for connecting the two driving means to the shaft selectively; and
- which includes means to sense the position of the boom relative to the two stations.

3. A combination as set forth in claim 2 in which the brake means is responsive to sensing means to stop the boom at a station when the low speed driving means is connected to the haft.

4. A combination as set forth in claim 3 in which the sensing means includes two proximity switches at locations corresponding to the two stations; and
- which includes means to make the brake means responsive to the two proximity switches selectively.

5. A combination as set forth in claim 1 in which the means to rotate the shaft includes:
- a flywheel;
- means to drive the flywheel continuously throughout an operating period; and
- clutch means to releasably engage the flywheel with the shaft.

6. A combination as set forth in claim 5 in which the flywheel is concentric to the shaft; and
- in which the clutch means comprises a first clutch component on the underside of the flywheel and a second clutch component carried by the shaft for movement towards the first component by upward axial movement of the shaft.

7. A combination as set forth in claim 1 which includes:
- support means mounted on the shaft by bearing means to move up and down with the shaft;
- means to hold the support means against rotation;
- a low speed motor on the support means; and
- clutch means to connect the lower speed motor to the shaft for moving the holder at lower speed along said orbit to and from the region of said bath.

8. A combination as set forth in claim 7 which includes brake means carried by said support means to decelerate the shaft.

9. In an apparatus to apply a coating to an object, for example to apply a coating of solder to a circuit board, the combination of:
- an upright rotatable and axially movable shaft;
- a holder for the object supported by the shaft and spaced from the shaft to move a circular orbit;
- a loading station on the orbit;
- a dipping station on the orbit provided with a bath of coating material;
- first and second sensing means including means carried by the shaft to sense arrival of the holder at the loading station and the dipping station respectively;
- means to initiate an operating cycle by rotating the shaft at relatively low speed to move the holder away from the loading station;
- means responsive to the second sensing means to stop the holder at the dipping station;
- means to lower the holder for a short period of time to immerse the holder in the bath at the dipping station;
- means to rotate the shaft at relatively high speed to spin the object to remove surplus coating material from the object by centrifugal force;
- means to decelerate the shaft to terminate the spinning operation;
- means to rotate the shaft at relatively low speed after the spinning operation; and
- means responsive to the first sensing means to stop the holder at the loading station to terminate the operating cycle.

10. In an apparatus to apply a coating to an object, for example to apply a coating of solder to a circuit board, the combination of:
- an upright rotatable and axially movable shaft;
- a holder for the object supported by the shaft and spaced from the shaft to move in a circular orbit;

a loading station on the orbit;

a dipping station on the orbit provided with a bath of coating material;

means to rotate the shaft at a relatively low speed to move the holder to the two stations selectively;

means to lower the shaft axially to immerse the holder in the bath at the dipping station;

means to elevate the lowered shaft at the end of a predetermined time interval to lift the holder from the bath;

means to rotate the shaft at a relatively high speed to spin the object to remove surplus coating material from the object by centrifugal force;

guide means surrounding the shaft; and control means projecting radially from the shaft, said guide means forming a vertical guideway for the control means to keep the holder aligned with the bath when the shaft is lowered to immerse the holder in the bath.

11. A combination as set forth in claim 10 in which said guide means has an upper portion to engage the control means to support the shaft at the loading position of the holder.

12. A combination as set forth in claim 11 in which said upper portion of the guide means forms a seat for the control means when the holder is at the loading position and which includes switch means for actuation by a seating of the control means, said switch means having a function in a control system for operating the shaft automatically through an operating cycle.

13. A combination as set forth in claim 12 which includes a switch responsive to elevation of the shaft to lift the control means out of said seat, said switch having a function in a control system for operating the shaft automatically through an operating cycle.

References Cited

UNITED STATES PATENTS

| | | | |
|---|---|---|---|
| 1,961,301 | 6/1934 | Nier | 118—54 |
| 1,977,704 | 10/1934 | Vaughan et al. | 118—54 |
| 2,447,351 | 8/1948 | Marinsky et al. | 118—54 |
| 2,544,199 | 3/1951 | Vredenburg | 118—56 |

CHARLES A. WILLMUTH, *Primary Examiner.*

R. I. SMITH, *Assistant Examiner.*